(12) United States Patent
Su

(10) Patent No.: US 8,368,443 B1
(45) Date of Patent: Feb. 5, 2013

(54) DIFFERENTIAL CHARGE PUMP CIRCUIT

(75) Inventor: Hsin-Chia Su, Tainan (TW)

(73) Assignee: Himax Technologies Limited, Tainan (TW)

( * ) Notice: Subject to any disclaimer, the term of this patent is extended or adjusted under 35 U.S.C. 154(b) by 24 days.

(21) Appl. No.: 13/351,879

(22) Filed: Jan. 17, 2012

(51) Int. Cl.
*H03L 7/06* (2006.01)

(52) U.S. Cl. ........ 327/157; 327/148; 327/149; 327/156; 327/158; 327/147

(58) Field of Classification Search .......... 327/147–149, 327/156–158
See application file for complete search history.

(56) References Cited

U.S. PATENT DOCUMENTS

| | | | | |
|---|---|---|---|---|
| 7,514,972 B2 * | 4/2009 | Dvorak et al. | ................. | 327/157 |
| 2003/0034813 A1 * | 2/2003 | Sanduleanu | ................... | 327/157 |
| 2004/0135603 A1 * | 7/2004 | Cho | ................ | 327/157 |
| 2005/0057313 A1 * | 3/2005 | Keaveney et al. | ................ | 331/16 |
| 2006/0208779 A1 * | 9/2006 | Lin et al. | ...................... | 327/158 |
| 2007/0176655 A1 * | 8/2007 | Dvorak et al. | ................. | 327/157 |
| 2007/0188205 A1 * | 8/2007 | Chen | .............................. | 327/157 |
| 2008/0238489 A1 * | 10/2008 | Sanduleanu et al. | ............. | 327/42 |
| 2009/0033383 A1 * | 2/2009 | Wyatt et al. | .................... | 327/157 |
| 2009/0189654 A1 * | 7/2009 | Clements et al. | ............. | 327/157 |
| 2010/0066420 A1 * | 3/2010 | Kaneko | ......................... | 327/157 |
| 2010/0090734 A1 * | 4/2010 | Eker | ............................ | 327/157 |

\* cited by examiner

*Primary Examiner* — Adam Houston
(74) *Attorney, Agent, or Firm* — J.C. Patents

(57) ABSTRACT

A differential charge pump circuit including a common mode bias unit, a first single-ended charge pump unit, and a second single-ended charge pump unit is provided. The common mode bias unit provides a differential signal to a low pass filter. The first single-ended charge pump unit provides a first current to the common mode bias unit or sinks the first current from the common mode bias unit via the first terminal based on an up signal and a down signal. The second single-ended charge pump unit provides a second current to the common mode bias unit or sinks the second current from the common mode bias unit via the second terminal based on the up signal and the down signal. The first and the second single-ended charge pump units respectively charge or discharge the first and the second terminals of the common mode bias unit.

16 Claims, 3 Drawing Sheets

DIFFERENTIAL CHARGE PUMP CIRCUIT

BACKGROUND OF THE INVENTION

1. Field of the Invention

The invention relates to an electronic circuit, and more particularly to a differential charge pump circuit.

2. Description of Related Art

Phase lock loop (PLL) circuit has a long history of development process and still plays a key role in technique discussions due to its wide application and high development potential. In brief, a basic function of the PLL circuit is to use an oscillation source with an extremely low variation to serve as a basic reference, and drive a device with a variable frequency under a feedback function of a closed loop control system, so that the frequency of the device is quickly and stably maintained at a same phase with the oscillation source, i.e. the frequency is phase locked.

For the PLL circuit, the charge pump (CP) is an important section for providing a real-time voltage to the voltage control oscillator (VCO). For the CP circuit, the required voltage is controlled by a signal modulated by the phase frequency detector (PFD). This voltage determines the oscillation frequency of the VCO. Once the oscillation frequency becomes too low, the CP controlled by the PFD would increase the voltage so as to increase the oscillation frequency of the VCO. On the contrary, once the oscillation frequency becomes too high, the voltage would be decreased to further decrease the oscillation frequency of the VCO.

On the other hand, for PLL circuit design, it can be categorized into single-ended architecture and differential architecture. The differential architecture may broaden the modulation range of the VCO, but the design for the CP circuit should also change to the differential architecture correspondingly. However, the conventional differential CP circuit requires a large amount of current to maintain a desire voltage. The current consumption for the conventional differential CP circuit is too much. Furthermore, a mismatch issue may occur due to the large amount of current.

SUMMARY OF THE INVENTION

The invention is directed to a differential charge pump circuit which combines the single-ended architecture and the differential architecture to provide a better charge pump performance.

The invention provides a differential charge pump circuit including a common mode bias unit, a first single-ended charge pump unit, and a second single-ended charge pump unit. The common mode bias unit includes a first terminal and a second terminal and provides a differential signal to a low pass filter via the first and the second terminals. The first single-ended charge pump unit is coupled to the first terminal. The first single-ended charge pump unit provides a first current to the common mode bias unit or sinks the first current from the common mode bias unit via the first terminal based on an up signal and a down signal. The second single-ended charge pump unit is coupled to the second terminal. The second single-ended charge pump unit provides a second current to the common mode bias unit or sinks the second current from the common mode bias unit via the second terminal based on the up signal and the down signal. The first and the second single-ended charge pump units respectively charge or discharge the first and the second terminals of the common mode bias unit, such that the common mode bias unit provides the differential signal to the low pass filter.

In an embodiment of the invention, when the first single-ended charge pump unit provides the first current to the common mode bias unit via the first terminal, the second single-ended charge pump unit sinks the second current from the common mode bias unit via the second terminal.

In an embodiment of the invention, when the second single-ended charge pump unit provides the second current to the common mode bias unit via the second terminal, the first single-ended charge pump unit sinks the first current from the common mode bias unit via the first terminal.

In an embodiment of the invention, the common mode bias unit biases the first and the second terminals at a common voltage by a third current. A value of the third current is smaller than values of the first and second currents.

In an embodiment of the invention, a value of the first current is equal to that of the second current.

In an embodiment of the invention, the common mode bias unit includes a first common mode bias path and a second common mode bias path. The first terminal of the common mode bias unit is located on the first common mode bias path. The second terminal of the common mode bias unit is located on the second common mode bias path. Each of the first and the second common mode bias paths provides a single-ended signal to form the differential signal, and the two single-ended signals are in opposite phases.

In an embodiment of the invention, the first common mode bias path includes a first bias current source and a second bias current source. The first bias current source includes a first terminal and a second terminal and provides a third current to the first terminal of the common mode bias unit. The first terminal of the first bias current source is coupled to a first voltage, and the second terminal of the first bias current source is coupled to the first terminal of the common mode bias unit. The second bias current source includes a first terminal and a second terminal and sinks the third current from the first terminal of the common mode bias unit. The first terminal of the second bias current source is coupled to the first terminal of the common mode bias unit, and the second terminal of the second bias current source is coupled to a second voltage.

In an embodiment of the invention, the second common mode bias path includes a third bias current source and a fourth bias current source. The third bias current source includes a first terminal and a second terminal and provides a third current to the second terminal of the common mode bias unit. The first terminal of the third bias current source is coupled to a first voltage, and the second terminal of the third bias current source is coupled to the second terminal of the common mode bias unit. The fourth bias current source includes a first terminal and a second terminal and sinks the third current from the second terminal of the common mode bias unit. The first terminal of the fourth bias current source is coupled to the second terminal of the common mode bias unit, and the second terminal of the fourth bias current source is coupled to a second voltage.

In an embodiment of the invention, the first single-ended charge pump unit includes a first switch module. The first switch module is coupled to the first terminal of the common mode bias unit. The first switch module provides the first current to the common mode bias unit or sinks the first current from the common mode bias unit via the first terminal of the common mode bias unit based on the up signal and the down signal.

In an embodiment of the invention, the first single-ended charge pump unit includes a first charge current source and a first discharge current source. The first charge current source includes a first terminal and a second terminal and provides the first current to the first terminal of the common mode bias unit via the first switch module. The first terminal of the first charge current source is coupled to a first voltage, and the second terminal of the first charge current source is coupled to the first switch module. The first discharge current source includes a first terminal and a second terminal and sinks the first current from the first terminal of the common mode bias unit via the first switch module. The first terminal of the first discharge current source is coupled to the first switch module, and the second terminal of the first discharge current source is coupled to a second voltage.

In an embodiment of the invention, the first switch module includes a first switch, a second switch, a third switch, and a fourth switch. The first switch includes a first terminal, a second terminal, and a control terminal. The first terminal of the first switch is coupled to the second terminal of the first charge current source, the second terminal of the first switch is coupled to the first terminal of the common mode bias unit, and the control terminal of the first switch is controlled by the up signal. The second switch includes a first terminal, a second terminal, and a control terminal. The first terminal of the second switch is coupled to the first terminal of the common mode bias unit, the second terminal of the second switch is coupled to the first terminal of the first discharge current source, and the control terminal of the second switch is controlled by the down signal. The third switch includes a first terminal, a second terminal, and a control terminal. The first terminal of the third switch is coupled to the second terminal of the first charge current source and the control terminal of the third switch is controlled by an inverted signal of the up signal. The fourth switch includes a first terminal, a second terminal, and a control terminal. The first terminal of the fourth switch is coupled to the second terminal of the third switch, the second terminal of the fourth switch is coupled to the first terminal of the first discharge current source, and the control terminal of the fourth switch is controlled by an inverted signal of the down signal.

In an embodiment of the invention, the first single-ended charge pump unit includes a first voltage follower. The first voltage follower includes an input terminal and an output terminal. The input terminal is coupled to the first terminal of the common mode bias unit, and the output terminal is coupled to the second terminal of the third switch.

In an embodiment of the invention, the second single-ended charge pump unit includes a second switch module. The second switch module is coupled to the second terminal of the common mode bias unit. The second switch module provides the second current to the common mode bias unit or sinks the second current from the common mode bias unit via the second terminal of the common mode bias unit based on the up signal and the down signal.

In an embodiment of the invention, the second single-ended charge pump unit includes a second charge current source and a second discharge current source. The second charge current source includes a first terminal and a second terminal and provides the second current to the second terminal of the common mode bias unit via the second switch module. The first terminal of the second charge current source is coupled to a first voltage, and the second terminal of the second charge current source is coupled to the second switch module. The second discharge current source includes a first terminal and a second terminal and sinks the second current from the second terminal of the common mode bias unit via the second switch module. The first terminal of the second discharge current source is coupled to the second switch module, and the second terminal of the second discharge current source is coupled to a second voltage.

In an embodiment of the invention, the second switch module includes a fifth switch, a sixth switch, a seventh switch, and an eighth switch. The fifth switch includes a first terminal, a second terminal, and a control terminal. The first terminal of the fifth switch is coupled to the second terminal of the second charge current source, the second terminal of the fifth switch is coupled to the second terminal of the common mode bias unit, and the control terminal of the fifth switch is controlled by the down signal. The sixth switch includes a first terminal, a second terminal, and a control terminal. The first terminal of the sixth switch is coupled to the second terminal of the common mode bias unit, the second terminal of the sixth switch is coupled to the first terminal of the second discharge current source, and the control terminal of the sixth switch is controlled by the up signal. The seventh switch includes a first terminal, a second terminal, and a control terminal. The first terminal of the seventh switch is coupled to the second terminal of the second charge current source, and the control terminal of the seventh switch is controlled by an inverted signal of the down signal. The eighth switch includes a first terminal, a second terminal, and a control terminal. The first terminal of the eighth switch is coupled to the second terminal of the seventh switch, the second terminal of the eighth switch is coupled to the first terminal of the second discharge current source, and the control terminal of the eighth switch is controlled by an inverted signal of the up signal.

In an embodiment of the invention, the first single-ended charge pump unit includes a second voltage follower. The second voltage follower includes an input terminal and an output terminal. The input terminal is coupled to the first terminal of the common mode bias unit, and the output terminal is coupled to the second terminal of the seventh switch.

According to the above descriptions, the differential charge pump circuit combines a common mode bias unit designed based on the differential architecture with two charge pump units designed based on the single-ended architecture, so as to consume less current than the conventional differential CP circuit. Therefore, the differential charge pump circuit of the disclosure provides a better charge pump performance.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
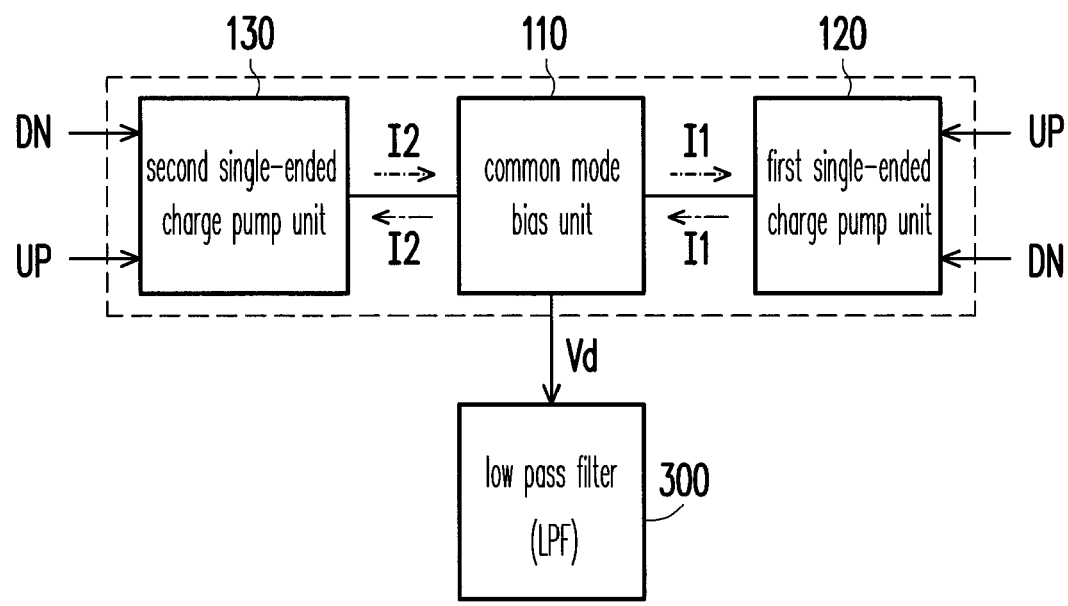
FIG. 1 illustrates a schematic diagram of a differential charge pump circuit according to an embodiment of the invention.

FIG. 1 illustrates a schematic diagram of a differential charge pump circuit according to an embodiment of the invention. Referring to FIG. 1, the differential charge pump circuit 100 of the present embodiment includes a common mode bias unit 110, a first single-ended charge pump unit 120, and a second single-ended charge pump unit 130. The common mode bias unit 110 includes a first terminal and a second terminal thereinside which are respectively coupled to the first single-ended charge pump unit 120 and the second single-ended charge pump unit 130.

The common mode bias unit 110 provides a differential signal Vd to a low pass filter 300. The first single-ended charge pump unit 120 is coupled to the first terminal of the common mode bias unit 110. The first single-ended charge pump unit 120 provides a first current I1 to the common mode bias unit 110 to charge the first terminal of the common mode bias unit 110 based on an up signal UP and a down signal DN. Alternatively, the first single-ended charge pump unit 120 may also sink the first current I1 from the first terminal of the common mode bias unit 110 to discharge the first terminal of the common mode bias unit 110 based on the up signal UP and the down signal DN under some conditions.

Furthermore, the second single-ended charge pump unit 130 is coupled to the second terminal of the common mode bias unit 110. The second single-ended charge pump unit 130 provides a second current I2 to the common mode bias unit to charge the second terminal of the common mode bias unit. Alternatively, the second single-ended charge pump unit 130 may also sink the second current I2 from the common mode bias unit to discharge the second terminal of the common mode bias unit based on the up signal UP and the down signal DN under some conditions. That is to say, the first and the second single-ended charge pump units 120 and 130 respectively charge or discharge the first and the second terminals of the common mode bias unit 110 based on the up signal UP and the down signal DN, such that the common mode bias unit provides the differential signal Vd to the low pass filter.

Specifically, in the present embodiment, when the first single-ended charge pump unit 120 provides the first current I1 to the common mode bias unit 110 via the first terminal, the second single-ended charge pump unit 130 sinks the second current I2 from the common mode bias unit 110 via the second terminal in the meanwhile. On the contrary, when the second single-ended charge pump unit 130 provides the second current I2 to the common mode bias unit 110 via the second terminal, the first single-ended charge pump unit 120 sinks the first current I1 from the common mode bias unit 110 via the first terminal. Accordingly, the first terminal and the second terminal inside the common mode bias unit 110 provide two single-ended signals in opposite phases to form the differential signal Vd transmitted to the low pass filter 300.

In the present embodiment, the first single-ended charge pump unit 120 provides one single-ended signal such as the first current I1, and it is designed based on the single-ended architecture. Similarly, the second single-ended charge pump unit 130 provides another single-ended signal such as the second current I2, and it is also designed based on the single-ended architecture. On the other hand, the common mode bias unit 110 provides the differential signal Vd to the low pass filter 300, and it is designed based on the differential architecture. In other words, the differential charge pump circuit 100 of the present embodiment combines the common mode bias unit 110 designed based on the differential architecture with the two charge pump units 120 and 130 designed based on the single-ended architecture.

Furthermore, the up signal UP and the down signal DN for controlling the two charge pump units 120 and 130 are provided from a phase frequency detector of a phase lock loop circuit (not shown). The differential charge pump circuit 100 and the low pass filter 300 are applied to the same phase lock loop circuit.

Figure 2:
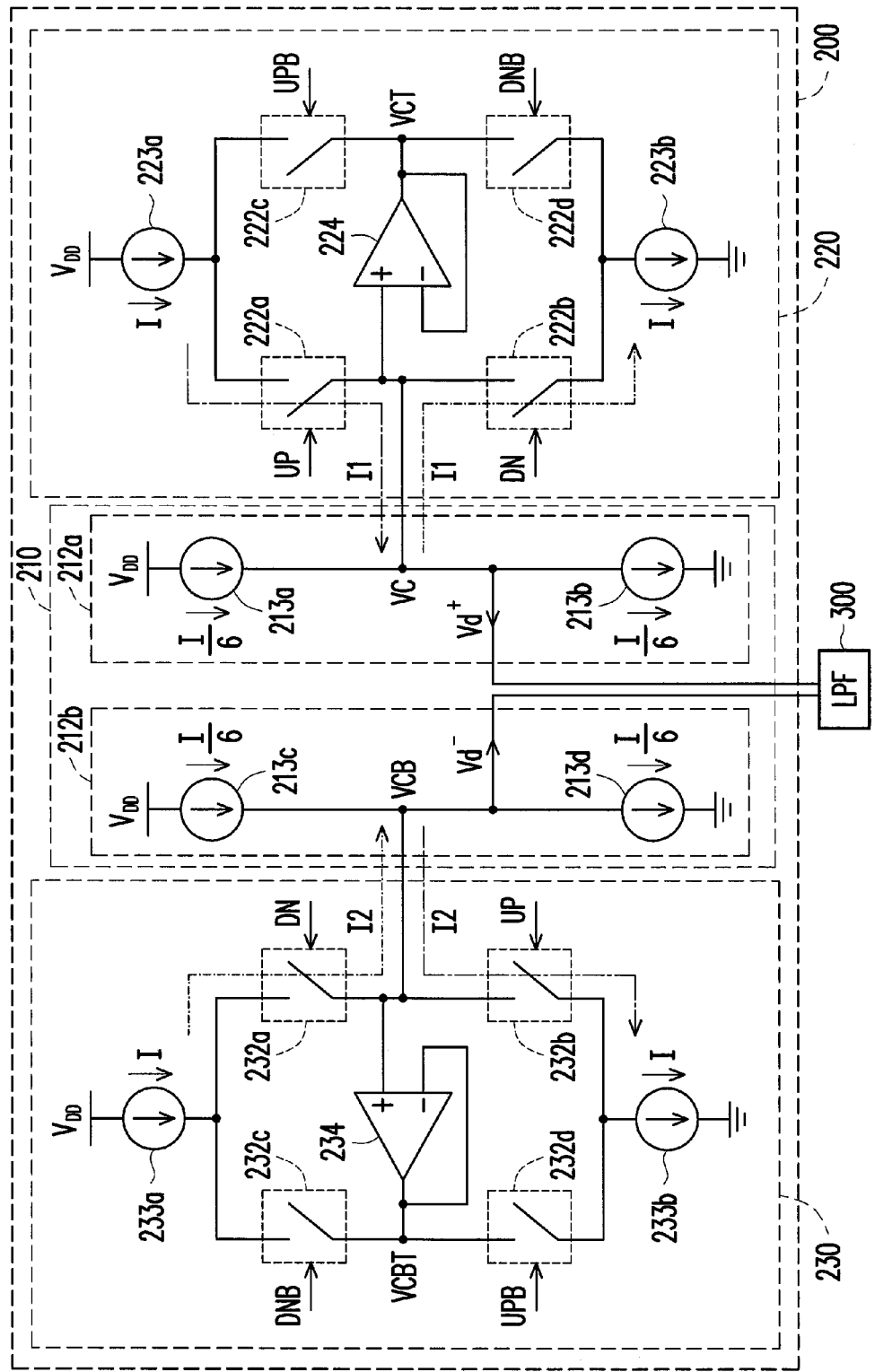
FIG. 2 illustrates a schematic diagram of a differential charge pump circuit according to another embodiment of the invention.

FIG. 2 illustrates a schematic diagram of a differential charge pump circuit according to another embodiment of the invention. Referring to FIG. 2, the differential charge pump circuit 200 of the present embodiment includes a common mode bias unit 210, a first single-ended charge pump unit 220, and a second single-ended charge pump unit 230.

In the present embodiment, the common mode bias unit 210 includes a first common mode bias path 212a and a second common mode bias path 212b. The first terminal VC of the common mode bias unit 210 is located on the first common mode bias path 212a. The second terminal VCB of the common mode bias unit 210 is located on the second common mode bias path 212b. Each of the first and the second common mode bias paths 212a and 212b provides a single-ended signal, i.e. the voltage signals at the first and the second terminals VC and VCB respectively, to form the differential signal Vd. In FIG. 2, two single-ended signals Vd+ and Vd− in opposite phases represent the differential signal Vd.

The first common mode bias path 212a includes a first bias current source 213a and a second bias current source 213b. The first bias current source 213a provides a third current to the first terminal VC of the common mode bias unit 210 to bias the first terminal VC at a specific common voltage such as 1 volt or 1.5 volts. The value of the common voltage is set according to design requirements. The first terminal of the first bias current source 213a is coupled to a first voltage, e.g. a system voltage $V_{DD}$, and the second terminal of the first bias current source 213a is coupled to the first terminal VC of the common mode bias unit 210. Herein, one-sixth of a unit current, i.e. I/6, is exemplary for the value of the third current provided by the first bias current source 213a, but the invention is not limited thereto. The ratio of the value of the third current to that of the unit current and the value of the unit current are set according to design requirements. Furthermore, the second bias current source 213b sinks the third current from the first terminal VC of the common mode bias unit 210. The first terminal of the second bias current source 213b is coupled to the first terminal VC of the common mode bias unit 210, and the second terminal of the second bias current source 213b is coupled to a second voltage. Herein, the second terminal of the second bias current source 213b is grounded.

Similarly, the second common mode bias path 212b includes a third bias current source 213c and a fourth bias current source 213d. The third bias current source 213c also provides the third current to the second terminal VCB of the common mode bias unit 210. Herein, the second terminal VCB is biased at the same specific common voltage as that of the first terminal VC. The first terminal of the third bias current source 213c is coupled to the system voltage $V_{DD}$, and the second terminal of the third bias current source 213c is coupled to the second terminal VCB of the common mode bias unit 210. The fourth bias current source 213d also sinks the third current from the second terminal VCB of the common mode bias unit 210. The first terminal of the fourth bias current source 213d is coupled to the second terminal VCB of the common mode bias unit 210, and the second terminal of the fourth bias current source 213d is grounded.

On the other hand, the first single-ended charge pump unit 220 includes a first switch module, a first charge current source 223a, a first discharge current source 223b, and a first voltage follower 224 in the present embodiment. The first switch module provides a first current I1 to the common mode bias unit 210 or sinks the first current I1 from the common mode bias unit 210 via the first terminal VC of the common mode bias unit 210 based on the up signal UP and the down signal DN.

To be specific, the first switch module includes a first switch 222a, a second switch 222b, a third switch 222c, and a fourth switch 222d. The first switch 222a includes a first terminal, a second terminal, and a control terminal. The first terminal of the first switch 222a is coupled to the second terminal of the first charge current source 223a, the second terminal of the first switch 222a is coupled to the first terminal VC of the common mode bias unit 210, and the control terminal of the first switch 222a is controlled by the up signal UP. The second switch 222b includes a first terminal, a second terminal, and a control terminal. The first terminal of the second switch 222b is coupled to the first terminal VC of the common mode bias unit 210, the second terminal of the second switch 222b is coupled to the first terminal of the first discharge current source 223b, and the control terminal of the second switch 222b is controlled by the down signal DN. The third switch 222c includes a first terminal, a second terminal, and a control terminal. The first terminal of the third switch 222c is coupled to the second terminal of the first charge current source 223a and the control terminal of the third switch is controlled by the inverted up signal UPB, i.e. a logically inverted signal of the up signal UP. The fourth switch 222d includes a first terminal, a second terminal, and a control terminal. The first terminal of the fourth switch 222d is coupled to the second terminal of the third switch 222c, the second terminal of the fourth switch 222d is coupled to the first terminal of the first discharge current source 223b, and the control terminal of the fourth switch 222d is controlled by the inverted down signal DNB, i.e. a logically inverted signal of the down signal DN.

The first charge current source 223a provides the first current I1 to the first terminal VC of the common mode bias unit 210 via the first switch 222a, so as to charge the first terminal VC when the first switch 222a is turned on by the up signal UP. The first terminal of the first charge current source 223a is coupled to the system voltage $V_{DD}$, and the second terminal of the first charge current source 223a is coupled to the first terminals of the first and the third switches 222a and 222c. The first discharge current source 223b sinks the first current I1 from the first terminal VC of the common mode bias unit 210 via the second switch 222b, so as to discharge the first terminal VC when the second switch 222b is turned on by the down signal DN. The first terminal of the first discharge current source 223b is coupled to the second terminals of the second and the fourth switches 222b and 222d, and the second terminal of the first discharge current source 223b is grounded. In the present embodiment, the unit current I is exemplary for the value of the first current I1 respectively provided by the first charge current source 223a and the first discharge current source 223b, but the invention is not limited thereto. The ratio of the value of the first current to that of the unit current is set according to design requirements.

Furthermore, the first voltage follower 224 includes an input terminal and an output terminal. The input terminal is coupled to the first terminal VC of the common mode bias unit 210, and the output terminal is coupled to the second terminal of the third switch 222c and the first terminal of the fourth switch 222d. Herein, an operational amplifier is exemplary for the first voltage follower 224, but the invention is not limited thereto. The non-inverting terminal of the operational amplifier serves as the input terminal of the first voltage follower 224, and the output terminal of the operational amplifier is connected to the inverting terminal thereof to form a feedback loop and serves as the output terminal of the first voltage follower 224.

On the other hand, the second single-ended charge pump unit 230 includes a second switch module, a second charge current source 233a, a second discharge current source 233b, and a second voltage follower 234 in the present embodiment. The second switch module provides a second current I2 to the common mode bias unit 210 or sinks the second current I2 from the common mode bias unit 210 via the second terminal VCB of the common mode bias unit 210 based on the up signal UP and the down signal DN.

To be specific, the second switch module includes a fifth switch 232a, a sixth switch 232b, a seventh switch 232c, and an eighth switch 232d. The fifth switch 232a includes a first terminal, a second terminal, and a control terminal. The first terminal of the fifth switch 232a is coupled to the second terminal of the second charge current source 233a, the second terminal of the fifth switch 232a is coupled to the second terminal VCB of the common mode bias unit 210, and the control terminal of the fifth switch 232a is controlled by the down signal DN. The sixth switch 232b includes a first terminal, a second terminal, and a control terminal. The first terminal of the sixth switch 232b is coupled to the second terminal VCB of the common mode bias unit 210, the second terminal of the sixth switch 232b is coupled to the first terminal of the second discharge current source 233b, and the control terminal of the sixth switch 232b is controlled by the up signal UP. The seventh switch 232c includes a first terminal, a second terminal, and a control terminal. The first terminal of the seventh switch 232c is coupled to the second terminal of the second charge current source 233a, and the control terminal of the seventh switch 232c is controlled by the inverted down signal DNB. The eighth switch 232d includes a first terminal, a second terminal, and a control terminal. The first terminal of the eighth switch 232d is coupled to the second terminal of the seventh switch 232c, the second terminal of the eighth switch 232d is coupled to the first terminal of the second discharge current source 233b, and the control terminal of the eighth switch 232d is controlled by the inverted up signal UPB.

The second charge current source 233a provides the second current I2 to the second terminal VCB of the common mode bias unit 210 via the fifth switch 232a, so as to charge the second terminal VCB when the fifth switch 232a is turned on by the down signal DN. The first terminal of the second charge current source 233a is coupled to the system voltage $V_{DD}$, and the second terminal of the second charge current source 233a is coupled to the first terminals of the fifth and the seventh switches 232a and 232c. The second discharge current source 233b includes a first terminal and a second terminal and sinks the second current I2 from the second terminal VCB of the common mode bias unit 210 via the sixth switch 232b, so as to discharge the second terminal VCB when the sixth switch 232a is turned on by the up signal UP. The first terminal of the second discharge current source 233b is coupled to the second terminals of the sixth and the eighth switches 232b and 232d, and the second terminal of the second discharge current source 233b is grounded. In the present embodiment, the unit current I is also exemplary for the value of the second current I2 respectively provided by the second charge current source 233a and the second discharge current source 233b, but the invention is not limited thereto. The multiple of the value of the second current relative to that of the unit current is set according to design requirements. It should be noted that the value of the first current I1 is equal to that of the second current I2, and the value of the third current I3 is smaller than the values of the first and second currents I1 and I2 in the present embodiment.

Furthermore, the second voltage follower 234 includes an input terminal and an output terminal. The input terminal is coupled to the first terminal of the common mode bias unit 210, and the output terminal is coupled to the second terminal of the seventh switch 232c and the first terminal of the eighth switch 232d. Herein, an operational amplifier is exemplary for the second voltage follower 234, but the invention is not limited thereto. The non-inverting terminal of the operational amplifier serves as the input terminal of the second voltage follower 234, and the output terminal of the operational amplifier is connected to the inverting terminal thereof to form a feedback loop and serves as the output terminal of the second voltage follower 234.

Figure 3:
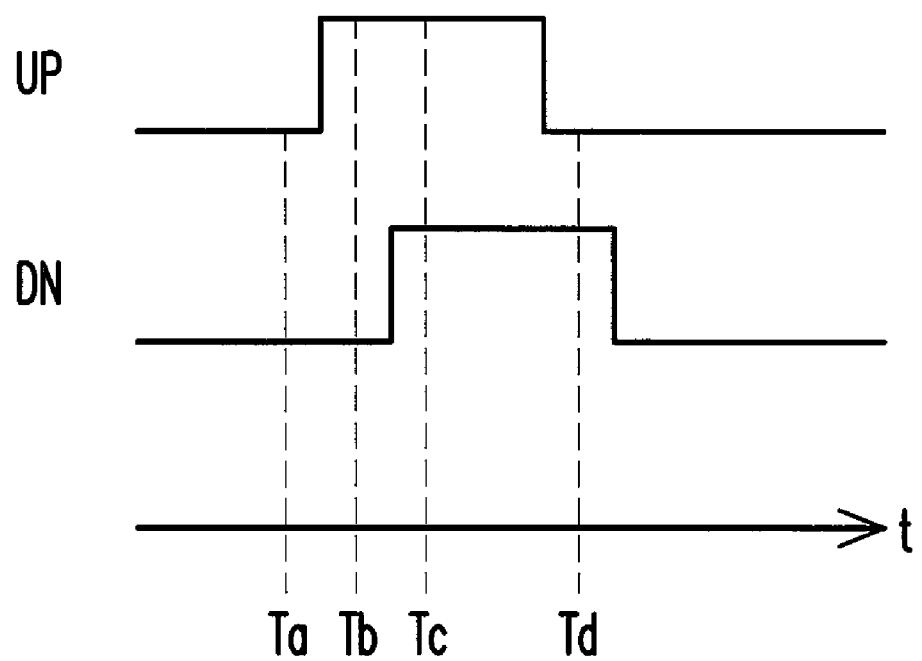
FIG. 3 illustrates schematic waveforms of the up and down signals in FIG. 2.

FIG. 3 illustrates schematic waveforms of the up and down signals in FIG. 2. Referring to FIG. 2 and FIG. 3, the up and down signals UP and DN stay at a low level at time Ta. For the first single-ended charge pump unit 220, the first switch 222a and the second switch 222b are turned off, and the third switch 222c and the fourth switch 222d are turned on in the meanwhile. The first current I1 provided flows from the first charge current source 223a to the first discharge current source 223b through the third switch 222c, the node VCT, and the fourth switch 222d. This current branch is configured to keep the first charge current source 223a and the first discharge current source 223b always on. On the other hand, for the second single-ended charge pump unit 230, the fifth switch 232a and the sixth switch 232b are turned off, and the seventh switch 232c and the eighth switch 232d are turned on at time Ta. The second current I2 provided flows from the second charge current source 233a to the second discharge current source 233b through the seventh switch 232c, the node VCBT, and the eighth switch 232d. This current branch is also configured to keep the second charge current source 233a and the second discharge current source 233b always on. At time Ta, neither the first terminal VC nor the second terminal VCB of the common mode bias unit 210 are charged or discharged.

At time Tb, the up signal UP goes to a high level, but the down signal DN still stays at the low level. At this time, the first switch 222a and the sixth switch 232b controlled by the up signal UP are turned on, and the second switch 222b and the fifth switch 232a controlled by the down signal DN are turned off. The first current I1 flows to the common mode bias unit 210 to charge the first terminal VC, and thus the voltage of the first terminal VC increases to be higher than the common voltage. On the contrary, the second current I2 is sunk from the common mode bias unit 210 to discharge the second terminal VCB, and thus the voltage of the second terminal VCB decreases to be lower than the same common voltage. Accordingly, the two single-ended signals Vd+ and Vd− are in opposite phases and form the differential signal Vd.

At time Tc, the up and down signals UP and DN both stay at the high level. For the first single-ended charge pump unit 220, the first switch 222a and the second switch 222b are turned on, and the third switch 222c and the fourth switch 222d are turned off in the meanwhile. The first current I1 provided flows from the first charge current source 223a to the first discharge current source 223b through the first switch 222a and the second switch 222b. For the second single-ended charge pump unit 230, the fifth switch 232a and the sixth switch 232b are turned on, and the seventh switch 232c and the eighth switch 232d are turned off at time Ta. The second current I2 provided flows from the second charge current source 233a to the second discharge current source 233b through the fifth switch 232a and the sixth switch 232b. At time Tc, neither the first terminal VC nor the second terminal VCB of the common mode bias unit 210 are charged or discharged.

At time Td, the up signal UP goes to the low level, but the down signal DN still stays at the high level. At this time, the first switch 222a and the sixth switch 232b controlled by the up signal UP are turned off, and the second switch 222b and the fifth switch 232a controlled by the down signal DN are turned on. The first current I1 is sunk from the common mode bias unit 210 to discharge the first terminal VC, and thus the voltage of the first terminal VC decreases to be lower than the common voltage. On the contrary, the second current I2 flows to the common mode bias unit 210 to charge the second terminal VCB, and thus the voltage of the second terminal VCB increases to be higher than the same common voltage. The two single-ended signals Vd+ and Vd− are still in opposite phases and thus form the differential signal Vd.

In summary, in the exemplary embodiments of the invention, the differential charge pump circuit combines a common mode bias unit designed based on the differential architecture with two charge pump units designed based on the single-ended architecture, and the bias currents provided by the common mode bias unit are smaller than the charge or discharge currents provided by the two charge pump units, such that the differential charge pump circuit consumes less current than the conventional differential CP circuit. Therefore, the differential charge pump circuit of the disclosure provides a better charge pump performance.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A differential charge pump circuit, comprising:
   a common mode bias unit comprising a first terminal and a second terminal and providing a differential signal to a low pass filter via the first and the second terminals;
   a first single-ended charge pump unit coupled to the first terminal and providing a first current to the common mode bias unit or sinking the first current from the common mode bias unit via the first terminal based on an up signal and a down signal; and
   a second single-ended charge pump unit coupled to the second terminal and providing a second current to the common mode bias unit or sinking the second current from the common mode bias unit via the second terminal based on the up signal and the down signal,
   wherein the first and the second single-ended charge pump units respectively charge or discharge the first and the second terminals of the common mode bias unit, such that the common mode bias unit provides the differential signal to the low pass filter.

2. The differential charge pump circuit as claimed in claim 1, wherein when the first single-ended charge pump unit provides the first current to the common mode bias unit via the first terminal, the second single-ended charge pump unit sinks the second current from the common mode bias unit via the second terminal.

3. The differential charge pump circuit as claimed in claim 1, wherein when the second single-ended charge pump unit provides the second current to the common mode bias unit via the second terminal, the first single-ended charge pump unit sinks the first current from the common mode bias unit via the first terminal.

4. The differential charge pump circuit as claimed in claim 1, wherein the common mode bias unit biases the first and the second terminals at a common voltage by a third current, wherein a value of the third current is smaller than values of the first and second currents.

5. The differential charge pump circuit as claimed in claim 1, wherein a value of the first current is equal to that of the second current.

6. The differential charge pump circuit as claimed in claim 1, wherein the common mode bias unit comprising:
- a first common mode bias path, wherein the first terminal of the common mode bias unit is located on the first common mode bias path; and
- a second common mode bias path, wherein the second terminal of the common mode bias unit is located on the second common mode bias path,
- wherein each of the first and the second common mode bias paths provides a single-ended signal to form the differential signal, and the two single-ended signals are in opposite phases.

7. The differential charge pump circuit as claimed in claim 6, wherein the first common mode bias path comprising:
- a first bias current source comprising a first terminal and a second terminal and providing a third current to the first terminal of the common mode bias unit, wherein the first terminal of the first bias current source is coupled to a first voltage, and the second terminal of the first bias current source is coupled to the first terminal of the common mode bias unit; and
- a second bias current source comprising a first terminal and a second terminal and sinking the third current from the first terminal of the common mode bias unit, wherein the first terminal of the second bias current source is coupled to the first terminal of the common mode bias unit, and the second terminal of the second bias current source is coupled to a second voltage.

8. The differential charge pump circuit as claimed in claim 6, wherein the second common mode bias path comprising:
- a third bias current source comprising a first terminal and a second terminal and providing a third current to the second terminal of the common mode bias unit, wherein the first terminal of the third bias current source is coupled to a first voltage, and the second terminal of the third bias current source is coupled to the second terminal of the common mode bias unit; and
- a fourth bias current source comprising a first terminal and a second terminal and sinking the third current from the second terminal of the common mode bias unit, wherein the first terminal of the fourth bias current source is coupled to the second terminal of the common mode bias unit, and the second terminal of the fourth bias current source is coupled to a second voltage.

9. The differential charge pump circuit as claimed in claim 6, wherein the first single-ended charge pump unit comprises:
- a first switch module coupled to the first terminal of the common mode bias unit, and providing the first current to the common mode bias unit or sinking the first current from the common mode bias unit via the first terminal of the common mode bias unit based on the up signal and the down signal.

10. The differential charge pump circuit as claimed in claim 9, wherein the first single-ended charge pump unit comprises:
- a first charge current source comprising a first terminal and a second terminal and providing the first current to the first terminal of the common mode bias unit via the first switch module, wherein the first terminal of the first charge current source is coupled to a first voltage, and the second terminal of the first charge current source is coupled to the first switch module; and
- a first discharge current source comprising a first terminal and a second terminal and sinking the first current from the first terminal of the common mode bias unit via the first switch module, wherein the first terminal of the first discharge current source is coupled to the first switch module, and the second terminal of the first discharge current source is coupled to a second voltage.

11. The differential charge pump circuit as claimed in claim 10, wherein the first switch module comprises:
- a first switch comprising a first terminal, a second terminal, and a control terminal, wherein the first terminal of the first switch is coupled to the second terminal of the first charge current source, the second terminal of the first switch is coupled to the first terminal of the common mode bias unit, and the control terminal of the first switch is controlled by the up signal;
- a second switch comprising a first terminal, a second terminal, and a control terminal, wherein the first terminal of the second switch is coupled to the first terminal of the common mode bias unit, the second terminal of the second switch is coupled to the first terminal of the first discharge current source, and the control terminal of the second switch is controlled by the down signal;
- a third switch comprising a first terminal, a second terminal, and a control terminal, wherein the first terminal of the third switch is coupled to the second terminal of the first charge current source, and the control terminal of the third switch is controlled by an inverted signal of the up signal; and
- a fourth switch comprising a first terminal, a second terminal, and a control terminal, wherein the first terminal of the fourth switch is coupled to the second terminal of the third switch, the second terminal of the fourth switch is coupled to the first terminal of the first discharge current source, and the control terminal of the fourth switch is controlled by an inverted signal of the down signal.

12. The differential charge pump circuit as claimed in claim 11, wherein the first single-ended charge pump unit comprises:
- a first voltage follower comprising an input terminal and an output terminal, wherein the input terminal is coupled to the first terminal of the common mode bias unit, and the output terminal is coupled to the second terminal of the third switch.

13. The differential charge pump circuit as claimed in claim 6, wherein the second single-ended charge pump unit comprises:
- a second switch module coupled to the second terminal of the common mode bias unit, and providing the second current to the common mode bias unit or sinking the second current from the common mode bias unit via the second terminal of the common mode bias unit based on the up signal and the down signal.

14. The differential charge pump circuit as claimed in claim 13, wherein the second single-ended charge pump unit comprises:
- a second charge current source comprising a first terminal and a second terminal and providing the second current to the second terminal of the common mode bias unit via the second switch module, wherein the first terminal of the second charge current source is coupled to a first voltage, and the second terminal of the second charge current source is coupled to the second switch module; and a second discharge current source comprising a first terminal and a second terminal and sinking the second current from the second terminal of the common mode bias unit via the second switch module, wherein the first terminal of the second discharge current source is coupled to the second switch module, and the second terminal of the second discharge current source is coupled to a second voltage.

15. The differential charge pump circuit as claimed in claim 14, wherein the second switch module comprises:
a fifth switch comprising a first terminal, a second terminal, and a control terminal, wherein the first terminal of the fifth switch is coupled to the second terminal of the second charge current source, the second terminal of the fifth switch is coupled to the second terminal of the common mode bias unit, and the control terminal of the fifth switch is controlled by the down signal;
a sixth switch comprising a first terminal, a second terminal, and a control terminal, wherein the first terminal of the sixth switch is coupled to the second terminal of the common mode bias unit, the second terminal of the sixth switch is coupled to the first terminal of the second discharge current source, and the control terminal of the sixth switch is controlled by the up signal;
a seventh switch comprising a first terminal, a second terminal, and a control terminal, wherein the first terminal of the seventh switch is coupled to the second terminal of the second charge current source, and the control terminal of the seventh switch is controlled by an inverted signal of the down signal; and
an eighth switch comprising a first terminal, a second terminal, and a control terminal, wherein the first terminal of the eighth switch is coupled to the second terminal of the seventh switch, the second terminal of the eighth switch is coupled to the first terminal of the second discharge current source, and the control terminal of the eighth switch is controlled by an inverted signal of the up signal.

16. The differential charge pump circuit as claimed in claim 15, wherein the first single-ended charge pump unit comprises:
a second voltage follower comprising an input terminal and an output terminal, wherein the input terminal is coupled to the first terminal of the common mode bias unit, and the output terminal is coupled to the second terminal of the seventh switch.

* * * * *